United States Patent
Spencer et al.

(10) Patent No.: US 6,906,964 B2
(45) Date of Patent: Jun. 14, 2005

(54) MULTIPLE BUFFER MEMORY INTERFACE

(75) Inventors: Andrew M. Spencer, Eagle, ID (US); Kenneth J. Eldredge, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 26 days.

(21) Appl. No.: 10/609,904

(22) Filed: Jun. 27, 2003

(65) Prior Publication Data
US 2005/0007814 A1 Jan. 13, 2005

(51) Int. Cl.$^7$ ................................................ G11C 7/00
(52) U.S. Cl. .......................... 365/189.05; 365/230.08; 365/185.09
(58) Field of Search ........................ 365/158, 230.06, 365/230.08, 189.05, 189.09, 200

(56) References Cited

U.S. PATENT DOCUMENTS 5,963,488 A * 10/1999 Inoue ........................ 365/200
6,430,103 B2 * 8/2002 Nakayama et al. ..... 365/230.03
6,760,255 B2 * 7/2004 Conley et al. ......... 365/185.11

OTHER PUBLICATIONS

"Double Data Rate (DDR) SDRAM"; 512Mb: x8, DDR 400 SDRAM Addendum, Micron Technology, Inc., 2003 (pp 1–8).

Andrew M. Spencer; "Nonvolatile Buffered Memory Interface," U.S. patent application number not yet assigned, filed Jun. 27, 2003 (22 p.).

Richard L. Hilton et al.; "Assisted Memory System," U.S. Appl. No. 10/384,053, filed Mar. 6, 2003 (21 p.).

* cited by examiner

Primary Examiner—Gene N. Auduong

(57) ABSTRACT

Disclosed herein are systems and apparatuses having memories with a multiple buffer memory interface. In one embodiment, an integrated memory device comprises: a memory array integrated on a substrate, and a multiple buffer memory interface integrated on the same substrate. The memory interface comprises multiple read buffers each associated with a different region of the memory array and configured to buffer only data for read operations on the associated region.

19 Claims, 2 Drawing Sheets

MULTIPLE BUFFER MEMORY INTERFACE

BACKGROUND

Many developing technologies have been embraced because they increase accessibility to information. Examples of such technologies include microfilm, magnetic tapes, magnetic disk media, optical disk media, and integrated memories. Integrated memories in particular offer a high degree of accessibility.

Integrated memories are electrical circuits that are configured to store information in digital form. This digital information, or "data," is readily accessible to any digital device appropriately coupled to the integrated memory. Depending on the particular technology employed, data can be accessed at truly astonishing rates.

Integrated memories are often classified as volatile or non-volatile. Volatile integrated memories suffer loss of stored data in the absence of electrical power, but this shortcoming may be offset by advantages in information density and access rates. Non-volatile memories retain their stored information in the absence of electrical power, but may suffer from a reduced information density, a reduced access rate, and/or a lack of programmability.

A new integrated memory technology is being developed that may offer programmability, non-volatility, high information density, and a moderate access rate. Magnetic integrated memories, as that term is used herein, are integrated memories that use magnetic fields to store data. These magnetic fields can be embedded in magnetic materials that do not rely on the continued presence of electrical power to retain data. A variety of sensing techniques may be employed to detect magnetic fields in these memories and to determine the data these fields represent.

Although the access rate of magnetic memory and other non-volatile memories are gradually being improved, they may still fall short of the access rates offered by certain volatile memory technologies (e.g., static random access memory "SRAM"). Hence, a method for reducing average access times of slow memory technologies may prove advantageous.

BRIEF SUMMARY

Accordingly, there is disclosed herein systems and apparatuses having memories with a multiple buffer memory interface. In one embodiment, an integrated memory device comprises: a memory array integrated on a substrate, and a multiple buffer memory interface integrated on the same substrate. The memory interface comprises multiple read buffers each associated with a different region of the memory array and configured to buffer only data for read operations on the associated region.

BRIEF DESCRIPTION OF THE DRAWINGS

For a detailed description of various invention embodiments, reference will now be made to the accompanying drawings in which.

NOTATION AND NOMENCLATURE

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to suggest that the scope of the disclosure, including the claims, is limited to that embodiment.

Figure 1:
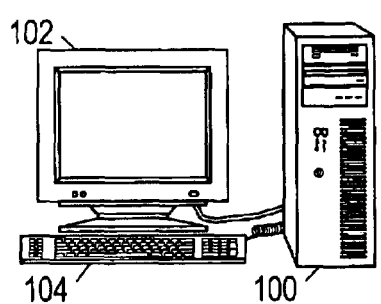
FIG. 1 is an external view of an exemplary digital system having a memory in accordance with various disclosed embodiments.

FIG. 1 shows a desktop computer as an exemplary digital device 100. To interact with a user, digital device 100 may be coupled to a text or graphical display 102, and to an input device 104. Display 102 and input device 104 may together operate as an interface between the user and digital device 100. Digital device 100 may perform certain actions prompted by user actuation of input device 104 and provide the user with a response via display 102. Digital device 100 may incorporate an integrated memory to determine the appropriate actions and/or responses to the user. Although digital device 100 is shown as a desktop computer, all other digital devices that may incorporate one or more integrated memories are contemplated, including but not limited to: digital cameras, personal digital assistants, cellular phones, digital music players, digital multimedia systems, and digital system controllers.

Figure 2:
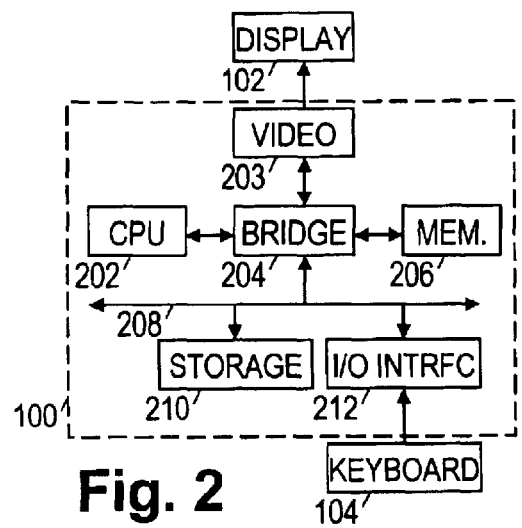
FIG. 2 is a block diagram of the digital system of FIG. 1.

FIG. 2 shows an example of a block diagram for digital device 100. Device 100 may include a central processing unit (CPU) 202 that is coupled by a bridge 204 to a system memory 206. CPU 202 may also be coupled by bridge 204 to a video card 203 that in turn couples to display 102. CPU 202 may be further coupled by bridge 204 to an expansion bus 208. Also coupled to the expansion bus 208 may be a storage device 210 and an input/output interface 212. Input device 104 may be coupled to device 100 via input/output interface 212.

CPU 202 may operate in accordance with software stored in memory 206 and/or storage device 210. Under the direction of the software, the CPU 202 may accept commands from an operator via a keyboard or some alternative input device 104, and may display desired information to the operator via display 102 or some alternative output device.

CPU 202 may control the operations of other system components to retrieve, transfer, and store data.

Bridge 204 coordinates the flow of data between components. Bridge 204 may provide dedicated, high-bandwidth, point-to-point buses for CPU 202, memory 206, and video card 203. In some embodiments, the bridge may be omitted and the CPU 202 may be directly coupled to memory 206. In such embodiments the processor may also be directly coupled to the expansion bus 208.

Memory 206 may store software and data for rapid access. Memory 206 may include integrated memory modules, one or more of which may be non-volatile.

Video card 203 may provide customized processing for graphics and data conversion from a memory-based format to a signal format suitable for display 102. Display 102 may provide data for use by an operator.

Expansion bus 208 may support communications between bridge 204 and multiple other computer components. Bus 208 may couple to removable modular components and/or components integrated onto a circuit board with bridge 204 (e.g., audio cards, network interfaces, data acquisition modules, modems).

Storage device 210 may store software and data for long-term preservation. Storage device 210 may be portable, or may accept removable media, or may be an installed component, or may be a integrated component on the circuit board. Storage device 210 may be a removable memory device such as a memory card. Alternatively, storage device 210 may be a nonvolatile integrated memory, a magnetic media storage device, an optical media storage device, or some other form of long-term information storage.

Input/output interface 212 may support communications with legacy components and devices not requiring a high-bandwidth connection. Input/output interface 212 may further include a real-time clock and may support communications with scan chains for low-level testing of the system.

Input device 104 may provide data to interface 212 in response to operator actuation. Input device 104 may be a keyboard or some other input device (e.g., pointing devices, buttons, sensors). Multiple input devices may be coupled to input/output interface 212 to provide data in response to operator actuation. Output devices (e.g., parallel ports, serial ports, printers, speakers, lights) may also be coupled to input/output interface 212 to communicate information to the operator.

Memory 206 and storage device 210 may be the primary data storage resources, and accordingly, they may include large amounts of integrated memory, possibly either in the form of relatively few large capacity integrated memory devices, or in the form of a large number of relatively small capacity integrated memory devices. However, other components of digital device 100 may also include integrated memory devices. For example, video card 203 may include one or more integrated memory devices for image storage and processing. Similarly, input/output interface 212 may include an integrated memory device for long-term storage of configuration parameters and basic input/output system (BIOS) routines.

Figure 3:
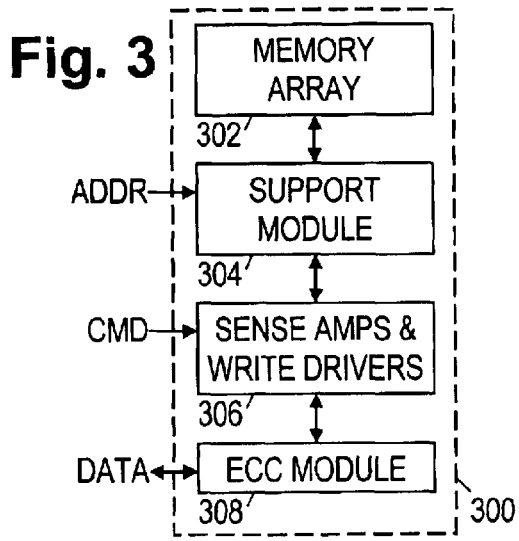
FIG. 3 is a block diagram of an assisted memory without a buffered memory interface.

FIG. 3 shows an example of an integrated memory device 300 without a buffered memory interface. Device 300 may be an assisted memory device such as that disclosed in related U.S. patent application Ser. No. 10/384,053, which is hereby incorporated herein by reference. An assisted memory device is a memory device that incorporates error correction techniques to cope with potential errors in storage or recovery of data. Such errors might be caused by isolated manufacturing faults in memory cells, unpredictable inter-cell coupling faults, transient signaling faults in the row and column lines during read or write operations, or such errors may have other causes.

Integrated memory device 300 includes a memory array 302, a support module 304, read and write module 306, and an error correction code (ECC) module 308. Memory array 302 includes a plurality of memory cells or memory elements each of which is capable of storing at least one bit of data. Memory array 302 may be of any memory technology, such as any random access memory (RAM) or read-only memory (ROM), including dynamic RAM (DRAM), extended data out RAM (EDO RAM), video RAM (VRAM), static RAM (SRAM), synchronous DRAM (SDRAM), magnetoresistive or magnetic RAM (MRAM), electrically programmable ROM (EPROM), and flash ROM. Although the following description is made primarily in the context of MRAM, the disclosed architecture and techniques are not so limited and are applicable to other memory storage technologies.

Each memory cell or element in array 302 is associated with a memory address, although each memory address may be associated with multiple memory cells. Support module 304 may receive an address signal and may responsively provide access to the associated memory cells in memory array 302. The access to selected memory cells is made via read and write module 306.

Read and write module 306 includes sense amplifiers to detect ("read") data values stored in the memory cells made accessible by support module 304. Module 306 may further include write drivers to store ("write") new data values in the memory cells. The operation of module 306 may be controlled by a command signal. The command signal may simply indicate when a read operation is desired and when a write operation is desired. When a write operation is indicated, the read and write module 306 may accept data from module 308 and store the data in the selected memory cells. Conversely, when a read operation is indicated, module 306 may retrieve data from the selected memory cells and provide the data to module 308. The command signal may further indicate when memory device 300 is enabled or disabled, and may also indicate when configuration information is being provided to memory device 300. The term "command signal" includes digital logic values sent on one or more traces. In some embodiments, module 306 may operate to decode multibit commands.

ECC module 308 is operable to detect and correct data errors arising in memory device 300. As data is received for storage, ECC module 308 encodes the data and converts data words into code words. By way of example, during a write operation an ECC module employing a (7,4,3) Hamming code may convert a four-bit data word into a seven-bit code word. The code word is then stored in memory cells associated with the specified memory address. Conversely, during a read operation, a seven-bit word is retrieved from memory cells associated with the specified memory address. The seven-bit word may be a code word, or it may contain a bit error. In either case, ECC module 308 decodes the seven-bit word, converting it into the appropriate four-bit data word, even if the retrieved seven-bit word contained an error. The data word is then provided as output data.

Of course, other error correction codes may be used. Examples of suitable error correcting codes include: Hamming codes, Goppa codes, Golay codes, Reed-Solomon codes, and convolutional codes. The coding may be done on a per-word basis, as described above. Alternatively, or in addition, the coding may be done on groups of words, so as to be able to correct an erroneous word within the group. Although the ECC module may require significant processing time during the decode process, pipelining techniques may be employed to sustain high throughput rates.

Figures 4, 5A, 5B:
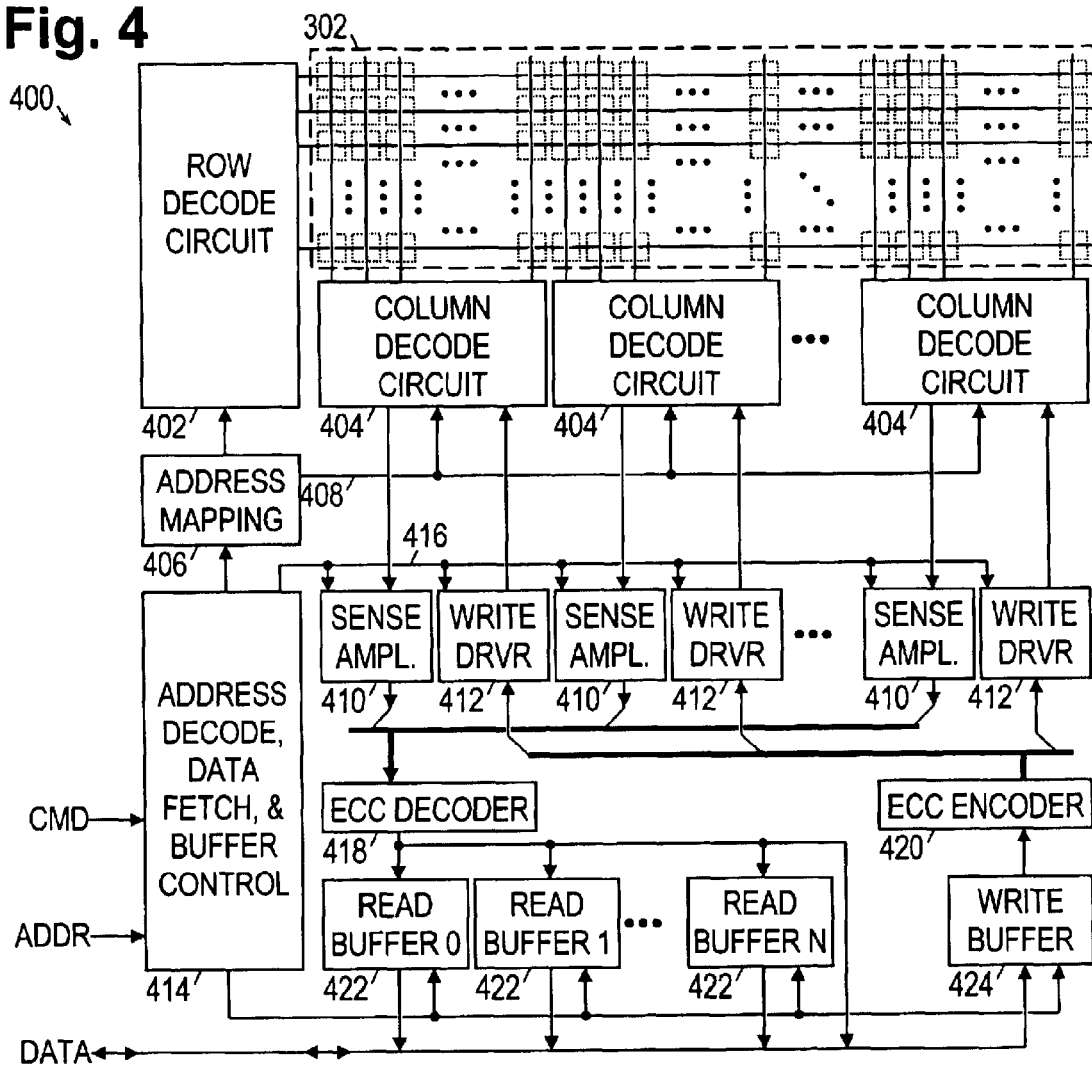
FIG. 4 is a block diagram of an assisted memory in accordance with various disclosed embodiments.
FIGS. 5a and 5b are examples of buffer management tables.

FIG. 4 shows an integrated memory device 400 having a buffered memory interface. The buffered memory interface preferably operates to reduce the average read latency by "reading ahead," i.e., retrieving data from memory locations subsequent to previously-read memory locations and storing the data in one or more buffers for faster access. Multiple buffers may be used to exploit locality of reference in disparate areas of memory.

Memory device 400 includes a memory array 302; a support module that includes row decoder 402, column decoder 404, and address mapping module 406; a read and write module that includes sense amplifiers 410 and write drivers 412; an ECC module that includes ECC decoder 418 and ECC encoder 420; and a buffered memory interface that may include an interface control 414, one or more read buffers 422, and an optional write buffer 424.

Memory array 302 comprises at least one memory device such as an MRAM with memory cells arranged in an array. Each magnetic memory storage element may comprise a data storage layer and a reference layer. The logic state of a magnetic memory element depends on the relative orientations of magnetization in the data storage and reference layers. The magnetization of each memory element assumes one of two stable orientations at any given time. These two stable orientations, parallel and anti-parallel, may represent logic values of "0" and "1."

The memory cells of array 302 are generally arranged in rows and columns, with the rows extending along one axis and the columns extending along a perpendicular axis. Only a relatively small number of memory cells are shown to aid in understanding. In practice, arrays of 1024×1024 memory cells or larger may be expected, but the claims are not so limited.

FIG. 4 shows row lines extending in a horizontal direction and column lines extending in a vertical direction. In one embodiment, there is one row line for each row of memory cells and one column line for each column of memory cells. Each memory cell is shown located at a crossing point of a corresponding row and column line. In one embodiment, a memory cell is made accessible when row decoder 402 asserts the corresponding row line, and column decoder 404 couples the corresponding column line to a sense amplifier 410 or a write driver 412. During read operations, the resistance of a memory cell may be detected by a sense amplifier, and during a write operation, the magnetization of the memory cell may be set by write driver 412.

Row decoder 402 may be operable to select a row line in response to a row address $A_R$, and the plurality of column decoder 404 may be operable to each select a column line in response to a column address $A_C$ 408. In response to the row address $A_R$, row decoder 402 may couple a corresponding row line to a known voltage level such as ground. In response to the column address $A_C$ 408, column decoder 402 may couple a corresponding column line to a sense amplifier 410 and/or a write driver 412. A selected plurality of memory cells lie at the intersections of selected row and column lines.

The row addresses $A_R$ and the column addresses $A_C$ may be supplied to row decoder 402 and column decoder 404, respectively, by address mapping module 406. In one embodiment, address mapping module 408 receives a memory address from interface control 414, and converts the received memory address to a physical address based on an internal mapping method that may replace defective memory cells with "spare" memory cells in the array. Further details on various embodiments of address mapping module 406 may be found in commonly-assigned U.S. patent application Ser. No. 10/044,542, filed on Jan. 11, 2002 (now U.S. Pat. No. 6,643,195, issued Nov. 4, 2003, and entitled Self-Healing MRAM, and U.S. patent application Ser. No. 09/766,364, filed on Jan. 19, 2001 (now U.S. Pat. No. 6,418,068, issued Jul. 9, 2002), and entitled Self-Healing Memory, both incorporated herein by reference, row decoder 402 and column decoder 404 may use the physical addresses provided by mapping module 406 to select memory cell, associated with the memory address.

Write drivers 412 may operate in parallel to set the logical states of the selected memory cells. The logical states may be bits of a code word provided by ECC encoder 420 in response to a data word. The code word is preferably designed to provide redundancy, i.e., additional information to aid in the determination of the correct data word when errors are encountered.

Sense amplifiers 410 may operate in parallel to detect the logical states of the selected memory cells. ECC decoder 418 may combine the data from sense amplifiers 410 to form a code word (with or without errors), and may process the code word to extract an error-free data word. Ideally, the ECC decoder may operate to correct transient errors, whereas the address mapping module 406 may operate to prevent errors caused by permanent defects in memory cells.

A number of ECC decoder implementations may exist, ranging from fast combinatorial logic to sequential state-machine based implementations. The Hamming code, Reed-Solomon codes, binary Golay code, binary Goppa code, Viterbi code or other algorithms may be used to generate the ECC code words based on a block of data of a predetermined size. Extended error correction capability and data efficiency can be achieved with larger data block sizes, more powerful ECC algorithms, but greater circuit complexity. Such added complexity need not be insurmountable if a buffered memory interface is used.

Memory device 400 may include a buffered memory interface in the form of an interface control 414, one or more read buffers 422, and an optional write buffer 424. The one or more read buffers 422 may operate under the control of interface control 414 to accept data from ECC decoder 418, and to provide outgoing data on the bi-directional data bus. Optional write buffer 424 may buffer incoming data from the bidirectional data bus, and provide the data to ECC encoder 420.

Before exploring the operation of interface control 414, a discussion of "the principle of locality" may be beneficial. The principle of locality may be stated as "the probability of an access to a given memory location is significantly higher than average when a nearby memory location has been recently accessed." In the context of a high-latency memory array, this principle may be exploited by retrieving from memory not just data from a requested memory address, but also data from nearby memory addresses to be stored in anticipation of later read requests. The data from nearby memory locations can be stored in a high-speed buffer, and provided with zero latency if the anticipated read request occurs.

The principle of locality is somewhat dependent on the software, firmware and/or hardware processes being executed by the digital device. Many processes may exhibit the principle of locality in a distributed pattern. For example, a software process may retrieve instructions for execution from one area of memory, and may retrieve data to be processed from another area of memory. Within each of these areas, the principle of locality applies, but the interspersing of these accesses may prevent a single buffer from operating effectively.

Interface control 414 accepts a command signal that indicates read and write commands, and further accepts an address signal that indicates memory addresses associated with the read and write commands. A clock signal may be included as part of the command signal to simplify the interface design in accepting commands and providing data. Interface control 414 may further provide a "data ready" signal to indicate to the processor that data is buffered and is available on the data lines.

In response to one or more read/write commands, interface control 414 generates a sequence of read/write operations on memory array 302 to satisfy the commands, but also to prepare the one or more read buffers 422 in anticipation of future commands. If a read command is received for an address whose data has already been retrieved into a read buffer 422 (or whose data still remains in optional write buffer 424), the interface control 414 causes the buffer to satisfy the command with little or no latency.

When the buffered memory interface includes multiple read buffers, interface control 414 may use a configuration table such as that shown in FIG. 5a. The table may be externally programmable, in which case interface control 414 accepts entries for the table when the command signal indicates a configuration mode for configuration of the interface control operating parameters.

The table of FIG. 5a associates read buffers with memory address ranges. Column 502 of the table specifies a start address of a memory range, column 504 specifies an end address of a memory range, and column 506 specifies a buffer that is to be associated with the memory range. Note that the table can be preset and implemented in hardware, and that alternatively the table may be expressed in variant forms. For example, column 504 may be eliminated, and the memory ranges defined by the intervals between addresses in columns 502. In an alternative embodiment, the table may be eliminated in favor of a hardwired mapping algorithm, e.g., a modulo function having a multiple of the buffer capacity as a base.

As interface control 414 receives a read command for an address whose data is not currently buffered, the interface control initiates a sequence of read operations on memory array 302 for the requested address and a block of neighboring addresses. The interface control 414 may use the table of FIG. 5a to determine the read buffer into which the block of data is to be stored. In this manner, strategic use of the read buffers may be made to minimize unnecessary buffer overwriting and data re-reading.

FIG. 5b shows a table which may be used by the interface control 414 to track the contents of read buffers 442. The columns of the table are a first memory address 510 and a range 512. Each buffer has a corresponding row in the table to indicate the memory address of the buffered data block and the number of data words in the data block. When a read command is first received, interface control 414 may use this table to determine whether the requested address is buffered in any of the read buffers. In an alternative embodiment, column 512 may be treated as a fixed constant in the design and eliminated.

Figure 6:
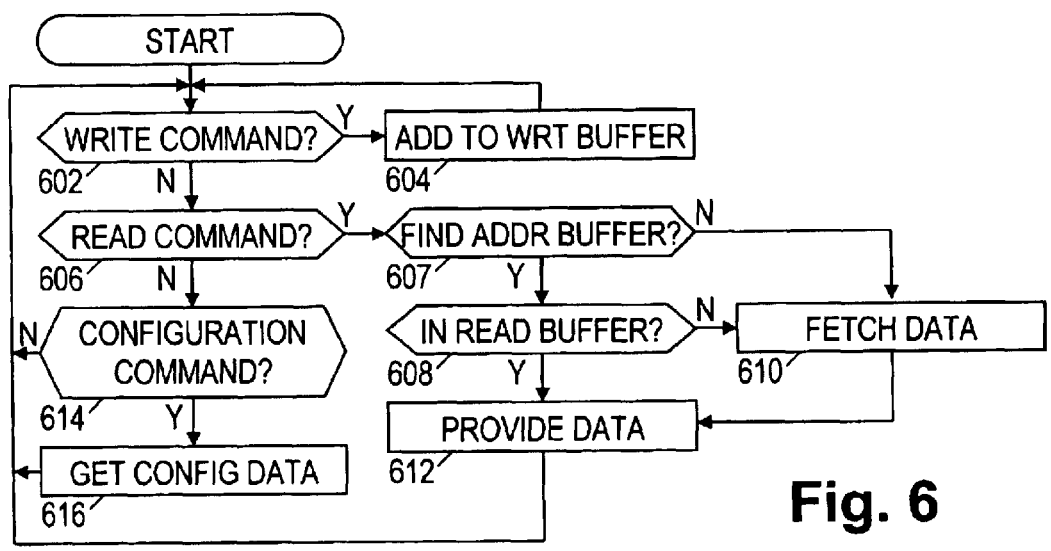
FIG. 6 is an exemplary flow diagram of integrated memory control in accordance with various disclosed embodiments.

FIG. 6 is a flow diagram that may show the architecture, functionality, and operation of possible implementations of the interface control 414. In this regard, each block may represent a module, segment, or portion of software (or firmware) code, which comprises one or more executable instructions for implementing the specified logical function (s). More likely, however, these flow diagrams may be implemented in hardware to support the desired data rates. The hardware implementation may take the form of a hardware state machine. It should also be noted that in some alternative implementations, the functions noted in the blocks may occur out of the order shown in FIG. 6. For example, the two blocks 602 and 606 shown in succession in FIG. 6 may in fact be executed substantially concurrently or the blocks may sometimes be executed in the reverse order.

Beginning in block 602, interface control 414 may determine whether a received command is a write command. If so, then in block 604 the interface control 414 may initiate a write operation, possibly by causing optional write buffer 424 to accept the write data. A separate state machine within interface control 414 may detect the presence of data in the write buffer and trigger in sequence the ECC encoder, the row and column decoders, and the write drivers. Once the interface control is ready to accept another command, it may return to block 602.

If the received command is determined not to be a write command in block 602, control passes to block 606 where the interface control 414 may determine whether the received command is a read command. If so, then in block 607, interface control 414 may use the table of FIG. 5a to determine which, if any, read buffer is associated with the area of memory being accessed by the read command. In block 608, interface control 608 may use the table of FIG. 5b to determine whether, the appropriate read buffer has data from the requested address buffered. If the data is not buffered, then in block 610 interface control 414 may initiate a sequence of read operations to fetch the data from the requested address and the neighboring addresses. Interface control 414 may further cause the appropriate read buffer to accept the data as it is decoded by the ECC decoder 418.

In block 612, interface control 414 may cause the read buffer to provide the data from the requested address as an output data signal in response to the read command. In one implementation, the interface control 414 does this operation by first asserting a "data ready" signal to inform the processor that data is available. Upon receiving an appropriate clock signal either from the processor or from an independent clock source, the interface control 414 drives the output data on the data lines. Once interface control 414 is ready to accept another command, control returns to block 602.

If a received command is not a read or write command, then in block 614 interface control 414 may determine whether the received command is a configuration command. Such a command may be used to set various operational parameters of interface control 414. Examples of adjustable parameters may include association of buffers with memory ranges, enablement or disablement of the buffering operations, read latencies. In block 616 interface control 414 may accept the configuration data into a corresponding register or table entry. Once interface control 414 is ready to accept another command, control returns to block 602.

Thus an integrated memory device having an integrated buffered memory interface has been described. The buffered memory interface may be integrated as part of the integrated memory device. The interface may advantageously provide for a reduced average latency in memory technologies having a relatively high latency. Such latencies might be found in some assisted memory architectures due to the ECC decoders employed therein. The reduced average latency in combination with an assisted memory architecture may enhance the commercial viability of nascent memory technologies, thereby encouraging further development of new technologies.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated memory device that comprises:
   a memory array integrated on a substrate;
   a multiple buffer memory interface integrated on said substrate, wherein
      the multiple buffer memory interface comprises:
         a plurality of read buffers each associated with a different region of the memory array and configured to buffer only data for read operations on the associated region; and
      an error correction code (ECC) decoder coupled between the memory array and the plurality of read buffers.

2. The device of claim 1, wherein the multiple buffer memory interface further comprises:
   an interface control module that is configured to receive read commands specifying a memory address, wherein the interface control module is coupled to the memory array to conduct read operations to satisfy the read commands and to prepare the read buffers to satisfy anticipated read commands.

3. The device of claim 1, wherein the multiple buffer memory interface employs a programmable table to associate the read buffers with different regions of the memory array.

4. The device of claim 1, wherein the multiple buffer memory interface implements an algorithmic mapping to associate the read buffers with different regions of the memory array.

5. The device of claim 1, wherein the multiple buffer memory interface further comprises a bypass around the read buffers, and wherein the multiple buffer memory interface is configurable to disable the read buffers.

6. The device of claim 1, further comprising an address mapping module configured to map memory addresses to physical addresses in the memory array, wherein the addresses are dynamically re-mapped based on results from the ECC decoder.

7. A method of providing access to a memory device, the method comprising:
   receiving a read command that comprises a read address;
   determining whether data from the read address is buffered in one of a plurality of read buffers;
   retrieving data from a location in a memory array associated with the read address if the data is not buffered, wherein the memory array is integrated on a substrate shared with the memory array;
   responding to the read command with data from said one of the plurality of read buffers if the data is buffered; and
   performing error correction on data retrieved from the memory array;
   wherein retrieving data from the memory array comprises converting the read address to a physical address in the memory array based on results of the error correction.

8. The method of claim 7, further comprising: before determining whether data from the read address is buffered, determining which of the plurality read buffers is associated with a region of memory that comprises the read address.

9. The method of claim 8, wherein the association between regions of memory and read buffers is specified in a programmable table.

10. The method of claim 8, further comprising:
    determining whether data buffering by the plurality of read buffers is enabled; and
    if the data buffering is enabled, retrieving data from a block of addresses that comprise the read address and buffering data from the block.

11. A digital device that comprises:
    a memory that comprises:
       a memory array integrated on a substrate; and
       a multiple buffer memory interface integrated on said substrate;
    a processor coupled to the memory and configured to retrieve instructions from memory addresses in one region of the memory array, and to process data from memory addresses in another region of the memory array; and
    a plurality of read buffers each associated with a different region of the memory array and configured to buffer only data for read operations on the associated region;
    wherein the memory further comprises an error correction code (ECC) decoder coupled between the memory array and the plurality of read buffers.

12. The device of claim 11, wherein the multiple buffer memory interface further comprises:
    an interface control module that is configured to receive read commands from the processor, wherein each read command specifies a memory address, wherein the interface control module is coupled to the memory array to conduct read operations to satisfy the read commands and to prepare the read buffers to satisfy anticipated read commands.

13. The device of claim 11, wherein the multiple buffer memory interface employs a programmable table to associate the read buffers with different regions of the memory array, and wherein the processor configures the programmable table to associate a read buffer with the region of the memory array containing instructions and to associate another read buffer with the region of the memory array containing data to be processed.

14. The device of claim 11, wherein the memory further comprises an address mapping module configured to map memory addresses to physical addresses in the memory array, based on results from the ECC decoder.

15. The device of claim 11, wherein the memory further comprises a write buffer to buffer data from write commands.

16. A memory device, comprising:
    a memory array comprising an array of magnetic random access memory (MRAM) cells; and
    a memory interface coupled to the memory array, the memory interface adapted to retrieve requested data from the array of MRAM cells and non-requested data from the array of MRAM cells, wherein the non-requested data is stored in a buffer;
    wherein the buffer is a read buffer coupled to an interface control to accept data from an error correction code (ECC) decoder.

17. The memory device of claim 16, wherein the buffer further comprises a write buffer.

18. The memory device of claim 16, wherein the memory interface retrieves requested data from a specified MRAM cell, and wherein the interface also retrieves non-requested data from an MRAM cell having an address associated with an address of the specified MRAM cell.

19. The memory device of claim 18, wherein the memory interface employs a programmable table to determine the address of the MRAM cell of the non-requested data and wherein the programmable table is adjusted based on results of the ECC decoder.

* * * * *

UNITED STATES PATENT AND TRADEMARK OFFICE
CERTIFICATE OF CORRECTION

PATENT NO. : 6,906,964 B2  
APPLICATION NO. : 10/609904  
DATED : June 14, 2005  
INVENTOR(S) : Andrew M. Spencer et al.

It is certified that error appears in the above-identified patent and that said Letters Patent is hereby corrected as shown below:

In column 5, line 67, delete "408" and insert -- 406 --, therefor.

In column 6, line 10, delete "09/766,364," and insert -- 09/766,354, --, therefor.

In column 6, lines 12-13, delete "reference, row" and insert -- reference. Row --, therefor.

In column 6, line 15, delete "cell," and insert -- cells --, therefor.

In column 7, line 56, delete "442." and insert -- 422. --, therefor.

In column 10, line 30, in Claim 11, delete "comprises" and insert -- comprises, --, therefor.

Signed and Sealed this

Twenty-seventh Day of October, 2009

David J. Kappos  
*Director of the United States Patent and Trademark Office*